(12) United States Patent
Tanaka et al.

(10) Patent No.: US 7,135,710 B2
(45) Date of Patent: Nov. 14, 2006

(54) SEMICONDUCTOR LIGHT-EMITTING DEVICE

(75) Inventors: Akira Tanaka, Kanagawa (JP); Masaaki Onomura, Tokyo (JP)

(73) Assignee: Kyowa Patent and Law Office, Tokyo (JP)

( * ) Notice: Subject to any disclaimer, the term of this patent is extended or adjusted under 35 U.S.C. 154(b) by 75 days.

(21) Appl. No.: 11/061,735

(22) Filed: Feb. 22, 2005

(65) Prior Publication Data

US 2005/0218415 A1 Oct. 6, 2005

(30) Foreign Application Priority Data

Apr. 5, 2004 (JP) ............... 2004-111260

(51) Int. Cl.
*H01L 29/22* (2006.01)
(52) U.S. Cl. .................... 257/97; 257/95; 257/615
(58) Field of Classification Search .......... 257/94–97
See application file for complete search history.

(56) References Cited

U.S. PATENT DOCUMENTS 5,693,963 A * 12/1997 Fujimoto et al. ............ 257/94
5,793,061 A * 8/1998 Ohuchi et al. ............... 257/96
5,959,307 A 9/1999 Nakamura et al.
6,084,251 A 7/2000 Tamamura et al.
6,233,266 B1 5/2001 Kawasumi
6,835,956 B1 12/2004 Nagahama et al.

FOREIGN PATENT DOCUMENTS

JP 2000-299497 10/2000

OTHER PUBLICATIONS

Office Action from corresponding Taiwan application dated Feb. 6, 2006 (4 pages).

* cited by examiner

*Primary Examiner*—Gene M. Munson
(74) *Attorney, Agent, or Firm*—Banner & Witcoff Ltd

(57) ABSTRACT

A first cladding layer of a first conductivity type formed above a crystal substrate, an active layer formed above the first cladding layer, a diffusion prevention layer formed on the active layer and preventing an impurity from diffusing into the active layer, an overflow prevention layer of a second conductivity type, the second conductivity type being different from the first conductivity type, which is formed on the diffusion prevention layer and prevents an overflow of carriers implanted into the active layer, and a second cladding layer of the second conductivity type formed above the overflow prevention layer are provided.

20 Claims, 3 Drawing Sheets

SEMICONDUCTOR LIGHT-EMITTING DEVICE

CROSS-REFERENCE TO RELATED APPLICATION

This application is based upon and claims the benefit of priority from prior Japanese Patent Application No. 2004-111260, filed on Apr. 5, 2004 in Japan, the entire contents of which are incorporated herein by reference.

BACKGROUND OF THE INVENTION

1. Field of the Invention

The present invention relates to semiconductor light-emitting devices.

2. Background Art

Semiconductor light-emitting devices emitting blue-violet laser beams having a wavelength in the 400 nm band have been developed for use in next-generation DVDs (digital versatile disks) etc. A ridge waveguide semiconductor light-emitting device is known as an example of such devices, with a device structure having, e.g., a double heterojunction on a GaN substrate, the double heterojunction being formed of a material containing a InGaAlN, and having an upper cladding layer in a shape of a ridge (for example, Japanese Patent Laid-Open Publication No. 2000-299497). In this ridge waveguide semiconductor light-emitting device, a non-doped n-type contact layer is formed of $Al_{0.05}Ga_{0.95}N$ on an n-type GaN substrate. An n-type contact layer is formed of Si-doped $Al_{0.05}Ga_{0.95}N$ on the non-doped n-type contact layer. An n-side electrode is formed in a region of the n-type contact layer, and a Si-doped n-type crack prevention layer is formed of $In_{0.08}Ga_{0.92}N$ in the remaining region. A multilayer film having a superlattice structure serving as an n-type cladding layer is formed on the n-type crack prevention layer by alternately stacking non-doped $Al_{0.14}Ga_{0.86}N$ layers and Si-doped GaN layers 160 times. A non-doped n-type guide layer is formed of GaN on the n-type cladding layer. An active layer having a multiple quantum well (MQW) structure is formed on the n-type guide layer by alternately stacking Si-doped $In_{0.01}Ga_{0.99}N$ barrier layers and undoped $In_{0.11}Ga_{0.89}N$ well layers three times and forming a barrier layer thereon. An Mg-doped p-type overflow prevention layer is formed of $Al_{0.4}Ga_{0.6}N$ on the active layer. A multilayer film having a superlattice structure serving as a p-type cladding layer is formed in a ridge shape on the p-type overflow prevention layer by alternately stacking non-doped $Al_{0.1}Ga_{0.9}N$ layers and Mg-doped GaN layers 100 times. A protection layer is formed of a Zr oxide at a side portion of the p-type cladding layer, and an Mg-doped p-type contact layer is formed of GaN on the p-type cladding layer. A p-side electrode is formed on the p-type cladding layer and the protection layer.

Since the band gap of the overflow prevention layer is wide, it is possible to shield electrons implanted from the n-side electrode, and to confine the electrons in the active layer. In order to improve the overflow prevention effect, however, it is necessary to increase the impurity concentration of the overflow prevention layer so as to further widen the band gap. In such a case, there is a problem in that the impurity is diffused into the active layer, thereby inhibiting luminescent recombination and decreasing luminous efficiency.

SUMMARY OF THE INVENTION

A semiconductor light-emitting device according to an aspect of the present invention includes:
a first cladding layer of a first conductivity type formed above a crystal substrate;
an active layer formed above the first cladding layer;
a diffusion prevention layer formed on the active layer and preventing an impurity from diffusing into the active layer;
an overflow prevention layer of a second conductivity type, the second conductivity type being different from the first conductivity type, which is formed on the diffusion prevention layer and prevents an overflow of carriers implanted into the active layer; and
a second cladding layer of the second conductivity type formed above the overflow prevention layer.

DESCRIPTION OF THE EMBODIMENTS

Hereinafter, embodiments of the present invention will be described with reference to the accompanying drawings.

(First Embodiment)

Figure 1:
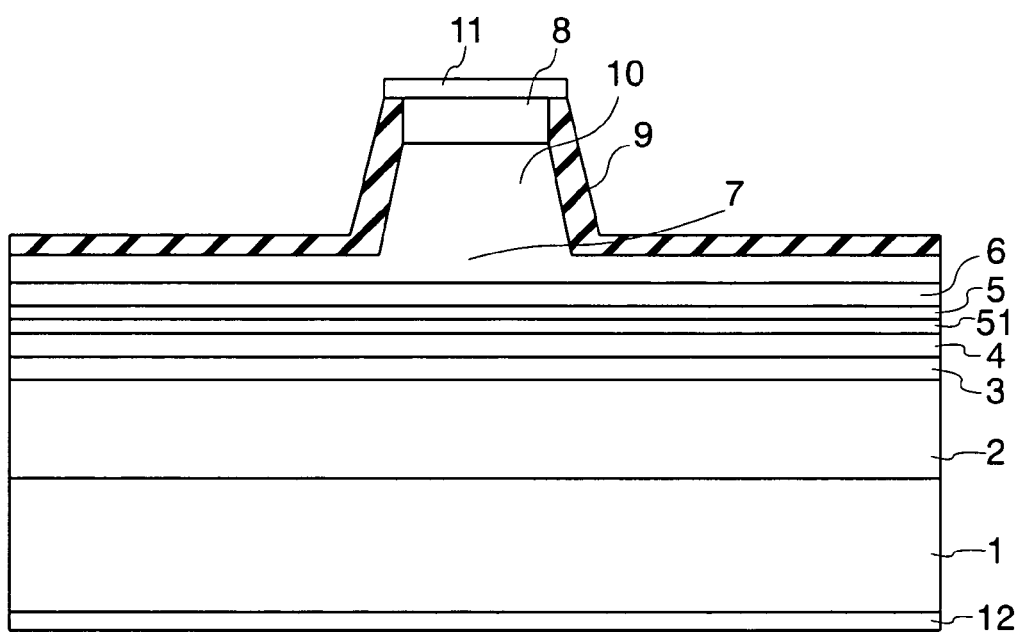
FIG. 1 is a sectional view showing the structure of a semiconductor light-emitting device according to a first embodiment of the present invention.

FIG. 1 shows the structure of a semiconductor light-emitting device according to a first embodiment of the present invention.

An n-type cladding layer 2 having a thickness of 0.5 μm or more and 2.0 μm or less is formed of $Al_{0.08}Ga_{0.92}N$ on an n-type substrate 1 of GaN. An n-type optical guide layer 3 having a thickness of 0.01 μm or more and 0.1 μm or less is formed of GaN on the n-type cladding layer 2. On the n-type optical guide layer 3, an active layer 4 having a multiple quantum well (MQW) structure is formed by alternately stacking, two to four times, barrier layers each having a thickness of 3 nm or more and 10 nm or less and being formed of Si-doped $In_{0.02}Ga_{0.98}N$, and well layers each having a thickness of 2 nm or more and 5 nm or less and being formed of non-doped. $In_{0.15}Ga_{0.85}N$, and forming thereon a barrier layer having a thickness of 3 nm or more and 10 nm or less and being formed of Si-doped $In_{0.02}Ga_{0.98}N$. A diffusion prevention layer 51 having a thickness of 0.02 μm or more and 0.1 μm or less is formed of non-doped GaN on the active layer 4. A $p^+$-type overflow prevention layer 5 having a thickness of 5 nm or more and 20 nm or less is formed of $Al_{0.2}Ga_{0.8}N$ on the diffusion prevention layer 51. If the diffusion prevention layer 51 were too thin, the impurity of the p+-type overflow prevention layer 5 would be diffused into the active layer 4, and if the diffusion prevention layer 51 were too thick, the overflow prevention layer 5 would become too distant from the active layer 4, thereby losing the overflow prevention effect.

A p-type optical guide layer 6 having a thickness of 0.01 μm or more and 0.1 μm or less is formed of GaN on the overflow prevention layer 5. A p-type cladding layer 7 having a thickness of 0.5 μm or more and 2.0 μm or less is formed of $Al_{0.08}Ga_{0.92}N$ on the optical guide layer 6. A p+-type contact layer 8 having a thickness of 0.02 μm or more and 0.2 μm or less is formed of GaN on the cladding layer 7. The contact layer 8 and the cladding layer 7 are formed to have a ridge shape, the ridge-shaped portion of the cladding layer 7 and the contact layer 8 serving as a ridge waveguide 10. The ridge waveguide 10 extends in a direction perpendicular to the paper surface of the drawing. That is to say, the ridge waveguide 10 forms a stripe pattern when viewed perpendicularly from above the paper surface.

A protection layer 9 having a thickness of 0.2 μm or more and 0.7 μm or less is formed of $SiO_2$ on the entire surface of the workpiece except for the portion directly above the ridge waveguide 10, a p-side electrode 11 is formed on the ridge waveguide 10, and an n-side electrode 12 is formed below the GaN substrate 1. The p-side electrode 11 can be formed of a layer containing at least one metal selected from Pt, Pd, Ni, Au, etc., a laminated layer formed by stacking two or more metals selected from the aforementioned metals, or a layer containing an alloy of the aforementioned metals. The n-side electrode 12 can be formed of a layer containing at least one metal selected from Ti, Pt, Au, Al, etc. a laminated layer formed by stacking two or more metals selected from the aforementioned metals, or a layer containing an alloy of the aforementioned metals. The cladding layers 2 and 7 can be superlattice layers each being formed by alternately growing $Al_{0.16}Ga_{0.84}N$ layers and GaN layers each having a thickness of 1 nm or more and 5 nm or less. It is preferable that the temperature at which the overflow prevention layer 5 and the diffusion prevention layer 51 are formed be higher than the temperature at which the active layer 4 is formed.

Figure 5:
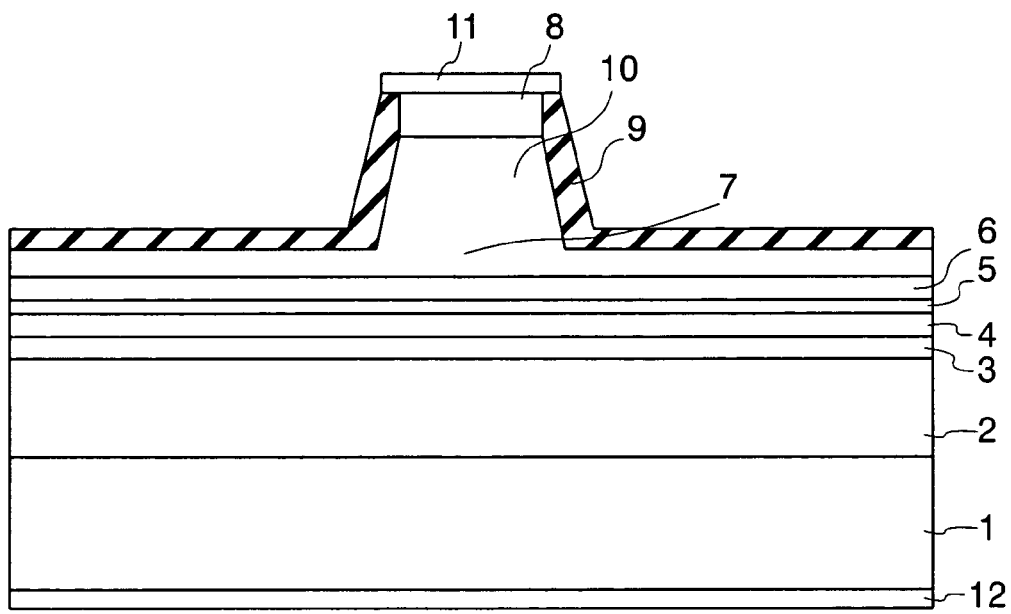
FIG. 5 is a sectional view showing the structure of semiconductor light-emitting devices according to the comparative examples 1 and 2.

A semiconductor light-emitting device, in which the diffusion prevention layer 51 is not formed and the impurity is not diffused into the active layer 4 in the semiconductor light-emitting device of this embodiment, is prepared as a comparative example 1, and a semiconductor light-emitting device, in which the diffusion prevention layer 51 is not formed and the impurity is diffused into the active layer 4, is prepared as a comparative example 2. The comparative examples 1 and 2 have a structure shown in FIG. 5.

Figure 2:
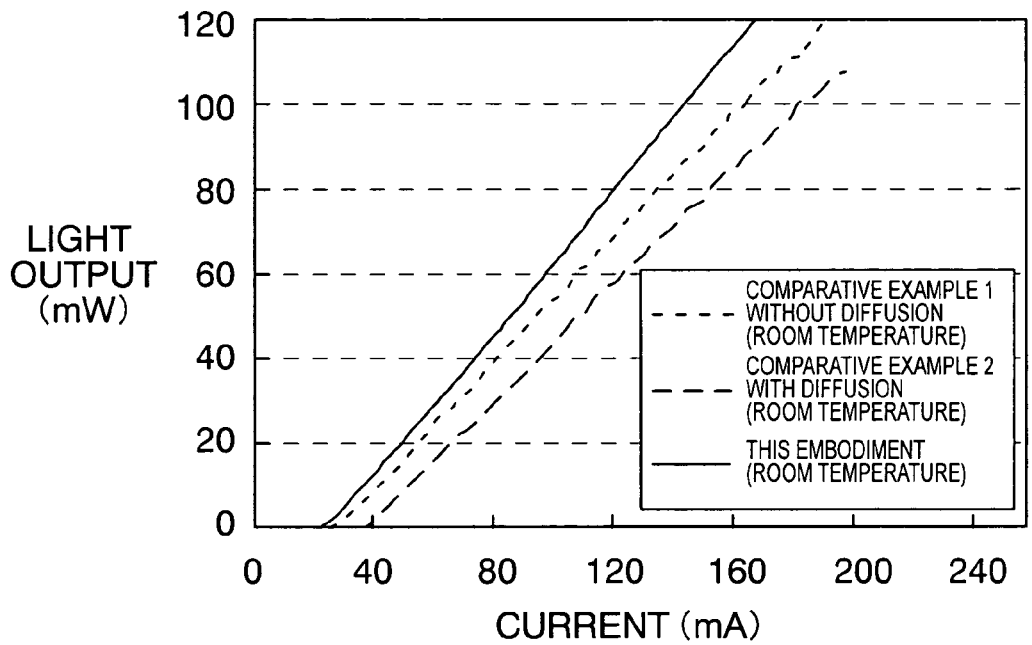
FIG. 2 is a characteristic graph obtained through a simulation of I–L characteristics of the semiconductor light-emitting device of the first embodiment and semiconductor light-emitting devices according to comparative examples 1 and 2 when the atmosphere is at a room temperature.
Figure 3:
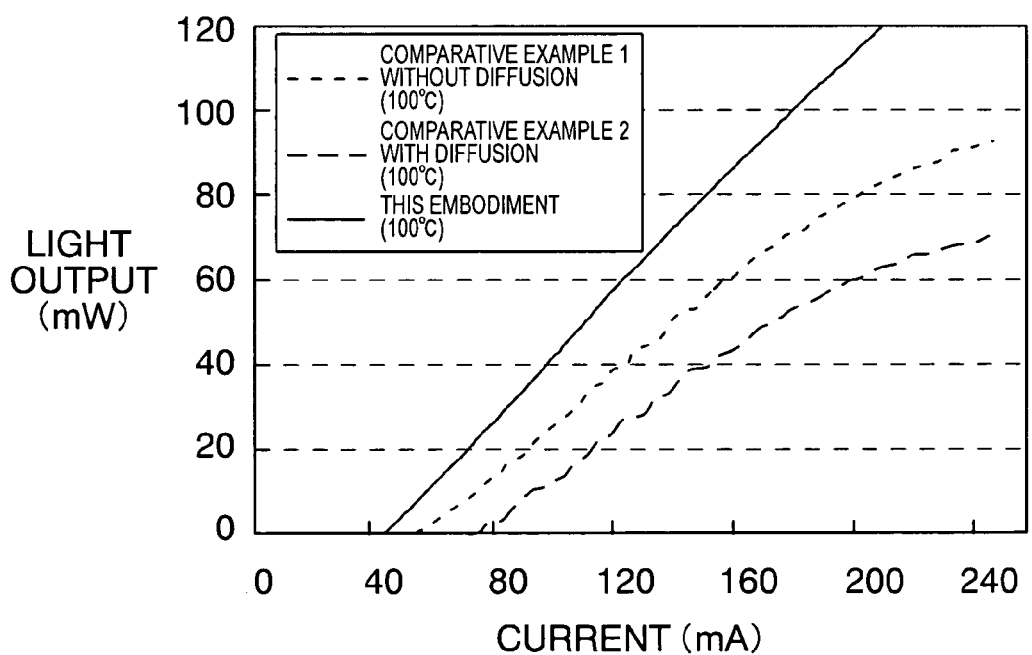
FIG. 3 is a graph obtained through a simulation of I–L characteristics of the semiconductor light-emitting device of the first embodiment and the semiconductor light-emitting devices according to the comparative examples 1 and 2 when the atmosphere is at 100° C.

FIG. 2 shows a simulation of the characteristics of a light output relative to an applied current (I–L characteristics) in the semiconductor light-emitting device of the first embodiment and semiconductor light-emitting devices according to comparative examples 1 and 2, when the atmosphere is at a room temperature. FIG. 3 shows a simulation when the atmosphere is at 100° C.

It is understood that in the case of the comparative example 2 in which an impurity is diffused into the active layer 4, the threshold current increases as compared to this embodiment and the comparative example 1, the efficiency (the gradient of the I–L characteristic line) is decreased, and the saturation of I–L characteristics at a high temperature becomes remarkable. The reason for this is an increase in non-luminescent recombination caused by displacement of p-n junction or formation of energy level due to impurity diffusion.

In contrast, in this embodiment, the threshold current is decreased and the efficiency is increased as compared with the comparative examples 1 and 2, so that no saturation of the I–L characteristics is found. This means that the characteristics are improved as compared with the case of comparative example 1 where there is no impurity diffusion in the active layer. The reason for this may be the existence of the diffusion prevention layer 51 between the active layer 4 and the overflow prevention layer 5, with which the overflow prevention layer 5 having a lower refractive index becomes a little more distant from the active layer 4, thereby increasing the degree of light confined in the active layer 4.

As described above, according to this embodiment, it is possible to curb impurity diffusion from an overflow layer to an active layer, thereby curbing a decrease in luminous efficiency.

It is preferable that the n-type cladding layer 2 and the p-type cladding layer 7 are superlattice layers formed of $Al_sGa_{1-s}N$ or $Al_sGa_{1-s}N/GaN$ ($0.0 < s \leq 0.3$).

Furthermore, it is preferable that active layer 4 is a multiple quantum well active layer formed of $In_xGa_{1-x}N/In_yGa_{1-y}N$ ($0.05 \leq x \leq 1.0$, $0 \leq y \leq 1.0$, $x > y$).

Moreover, it is preferable that the overflow prevention layer 5 is formed of $Al_tGa_{1-t}N$ with the stoichiometric ratio t of Al being greater than the stoichiometric ratio s of Al in the cladding layers 2 and 7.

Further, it is preferable that the diffusion prevention layer 51 is formed of $Al_uGa_{1-u}N (0 \leq u < t)$, the stoichiometric ratio u of Al in the diffusion prevention layer 51 being 0 or more, and smaller than the stoichiometric ratio t of Al in the overflow prevention layer 5. With such a structure, the refractive index becomes greater, thereby increasing the degree of light confined in the active layer.

In addition, it is preferable that the impurity concentration of the overflow prevention layer 5 is $5 \times 10^{18}/cm^{-3}$ or more, and the diffusion prevention layer is a non-doped layer. With such a structure, it is possible to curb overflow of carriers from the active layer further.

Furthermore, it is desirable that the ridge width of the ridge waveguide 10 is 1.5 μm or more and 2.5 μm or less. When the ridge width is less than 1.5 μm, the resistance value increases, thereby increasing the operating voltage. When the ridge width is more than 2.5 μm, a high-order mode oscillation is likely to begin. Moreover, it is desirable that the thickness of the second cladding layer 7 except for the portion of the ridge waveguide 10 is 0.03 μm or more and 0.2 μm or less. When the thickness of the second cladding layer 7 except for the portion of the ridge waveguide 10 is less than 0.03 μm, the difference in refractive index between the ridge portion and the other portions becomes great, thereby easily causing a high-order mode oscillation. When the thickness is more than 0.20 μm, the current spreads in a horizontal direction, thereby increasing the reactive current.

(Second Embodiment)

Figure 4:
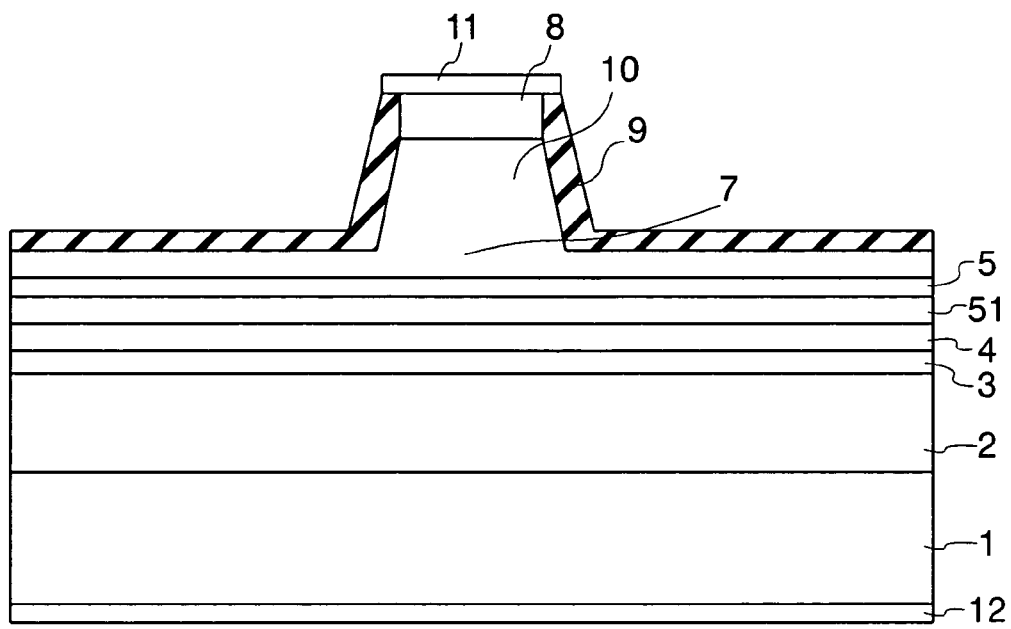
FIG. 4 is a sectional view showing the structure of a semiconductor light-emitting device according to a second embodiment of the present invention.

FIG. 4 shows the structure of a semiconductor light-emitting device according to a second embodiment of the present invention.

The semiconductor light-emitting device according to this embodiment has a structure in which the diffusion prevention layer 51 of non-doped GaN is designed to be thicker than that of the first embodiment shown in FIG. 1, e.g., 0.1 μm to 0.15 μm, and to have an optical guide function, and the p-type optical guide layer 6 of GaN is removed. Generally, the closer the overflow prevention layer 5 is to the active layer 4, the greater the effect. However, even if the active layer 4 and the overflow prevention layer are a little more distant from each other, it is possible to keep the overflow prevention effect by increasing the impurity concentration to improve the barrier effect. Accordingly, in this embodiment, the impurity concentration of the overflow prevention layer 5 is designed to be higher than that of the first embodiment.

Like the first embodiment, in this embodiment, it is possible to curb the impurity diffusion from the overflow layer to the active layer, thereby curbing the degradation of luminous efficiency.

As described above, according to the embodiments of the present invention, it is possible to curb the impurity diffusion from the overflow layer to the active layer, thereby curbing the degradation of luminous efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor light-emitting device comprising:
   a first cladding layer of a first conductivity type formed above a crystal substrate;
   an active layer formed above the first cladding layer;
   a diffusion prevention layer formed on the active layer and preventing an impurity from diffusing into the active layer;
   an overflow prevention layer of a second conductivity type, the second conductivity type being different from the first conductivity type, which is formed on the diffusion prevention layer and prevents an overflow of carriers implanted into the active layer; and
   a second cladding layer of the second conductivity type formed above the overflow prevention layer.

2. The semiconductor light-emitting device according to claim 1, wherein an impurity concentration of the overflow prevention layer is $5 \times 10^{18}/cm^{-3}$ or more, and the diffusion prevention layer is a non-doped layer.

3. The semiconductor light-emitting device according to claim 1, wherein a thickness of the overflow prevention layer is 5 nm or more and 20 nm or less, and a thickness of the diffusion prevention layer is 0.02 μm or more and 0.15 μm or less.

4. The semiconductor light-emitting device according to claim 1, wherein the diffusion prevention layer is a GaN layer.

5. The semiconductor light-emitting device according to claim 4, wherein a thickness of the diffusion prevention layer is 0.02 μm or more and 0.15 μm or less.

6. The semiconductor light-emitting device according to claim 1, wherein the overflow prevention layer is formed of $Al_tGa_{1-t}N$ (t>0.16).

7. The semiconductor light-emitting device according to claim 1, wherein the active layer has a multiple quantum well structure formed by alternately stacking, two to four times, barrier layers each having a thickness of 3 nm or more and 10 nm or less and well layers each having a thickness of 2 nm or more and 5 nm or less, and forming a barrier layer having a thickness of 3 nm or more and 10 nm or less.

8. The semiconductor light-emitting device according to claim 1, wherein the second cladding layer of the second conductivity type includes a first layer provided above the overflow prevention layer and a ridge portion provided on the first layer.

9. The semiconductor light-emitting device according to claim 1, wherein a ridge width of the second cladding layer in a ridge shape is 1.5 μm or more and 2.5 μm or less.

10. The semiconductor light-emitting device according to claim 1, wherein a thickness of the second cladding layer except for a ridge portion is 0.03 μm or more and 0.2 μm or less.

11. The semiconductor light-emitting device according to claim 1, wherein the first cladding layer of the first conductivity type and the second cladding layer of the second conductivity type are superlattice layers formed of $Al_sGa_{1-s}N$ or $Al_sGa_{1-s}N/GaN$ (0.0<s≦0.3), the active layer is a multiple quantum well active layer formed of $In_xGa_{1-x}N/In_yGa_{1-y}N$ (0.05≦x≦1.0, 0≦y≦1.0, x>y), the overflow prevention layer is formed of $Al_tGa_{1-t}N$ (t>s), and the diffusion prevention layer is formed of $Al_uGa_{1-u}N$ (0≦u<t).

12. The semiconductor light-emitting device according to claim 11, wherein an impurity concentration of the overflow prevention layer is $5 \times 10^{18}/cm^{-3}$ or more, and the diffusion prevention layer is a non-doped layer.

13. The semiconductor light-emitting device according to claim 11, wherein a thickness of the overflow prevention layer is 5 nm or more and 20 nm or less, and a thickness of the diffusion prevention layer is 0.02 μm or more and 0.15 μm or less.

14. The semiconductor light-emitting device according to claim 1, wherein the diffusion prevention layer is a GaN layer.

15. The semiconductor light-emitting device according to claim 14, wherein a thickness of the diffusion prevention layer is 0.02 μm or more and 0.15 μm or less.

16. The semiconductor light-emitting device according to claim 11, wherein the overflow prevention layer is formed of $Al_tGa_{1-t}N$ (t>0.16).

17. The semiconductor light-emitting device according to claim 11, wherein the active layer has a multiple quantum well structure formed by alternately stacking, two to four times, barrier layers each having a thickness of 3 nm or more and 10 nm or less and well layers each having a thickness of 2 nm or more and 5 nm or less, and forming a barrier layer having a thickness of 3 nm or more and 10 nm or less.

18. The semiconductor light-emitting device according to claim 11, wherein the second cladding layer of the second conductivity type includes a first layer provided above the overflow prevention layer and a ridge portion provided on the first layer.

19. The semiconductor light-emitting device according to claim 1, wherein a ridge width of the second cladding layer in a ridge shape is 1.5 μm or more and 2.5 μm or less.

20. The semiconductor light-emitting device according to claim 1, wherein a thickness of the second cladding layer except for a ridge portion is 0.03 μm or more and 0.2 μm or less.

* * * * *